(12) United States Patent
Tang et al.

(10) Patent No.: US 11,486,934 B2
(45) Date of Patent: Nov. 1, 2022

(54) METHOD, DEVICE AND SYSTEM FOR RECOVERING RECOVERABLE FADED CAPACITY OF BATTERY

(71) Applicant: Contemporary Amperex Technology Co., Limited, Ningde (CN)

(72) Inventors: Shenzhi Tang, Ningde (CN); Mingshu Du, Ningde (CN); Shichao Li, Ningde (CN); Jian Ruan, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 208 days.

(21) Appl. No.: 16/853,289

(22) Filed: Apr. 20, 2020

(65) Prior Publication Data

US 2020/0341073 A1    Oct. 29, 2020

(30) Foreign Application Priority Data

Apr. 25, 2019 (CN) .......................... 201910338265.5

(51) Int. Cl.
| | |
|---|---|
| *G01R 31/3842* | (2019.01) |
| *B60L 58/12* | (2019.01) |
| *G01R 31/36* | (2020.01) |
| *H01M 10/48* | (2006.01) |

(52) U.S. Cl.
CPC .......... *G01R 31/3842* (2019.01); *B60L 58/12* (2019.02); *G01R 31/3648* (2013.01); *H01M 10/48* (2013.01); *H01M 2220/20* (2013.01)

(58) Field of Classification Search
CPC .......... G01R 31/3842; G01R 31/3648; H01M 10/44; H01M 10/42; H01M 10/48; H01M 2010/4271; H01M 2010/4278; H01M 2220/20; H01M 10/4257; H01M 10/052; H02J 7/007182; H02J 7/007; H02J 2007/0067; H02J 7/0069; H02J 7/045;
(Continued)

(56) References Cited

U.S. PATENT DOCUMENTS 5,252,411 A * 10/1993 Yokokawa .......... H01M 10/443
429/62
7,442,470 B2 * 10/2008 Ozaki ................... H01M 4/587
429/231.8
(Continued)

FOREIGN PATENT DOCUMENTS

| CN | 101093904 A | 12/2007 |
|---|---|---|
| CN | 102315494 A | 1/2012 |

(Continued)

OTHER PUBLICATIONS

Extended European Search Report issued in European Application No. 20170166.1, dated Sep. 18, 2020, 8 pages.

*Primary Examiner* — Helen Rossoshek
(74) *Attorney, Agent, or Firm* — Sterne, Kessler, Goldstein & Fox P.L.L.C.

(57) ABSTRACT

A method, a device and a system for recovering recoverable faded capacity of a battery. The method includes determining the recoverable faded capacity of the battery, determining a corresponding lower limit of a battery parameter according to the recoverable faded capacity of the battery, and instructing a discharging device to discharge the battery to the corresponding lower limit of the battery parameter.

13 Claims, 4 Drawing Sheets

(58) Field of Classification Search
CPC ... H02J 7/00306; H02J 7/00714; B60L 58/12; Y02E 60/10; Y02T 10/70
See application file for complete search history.

(56) References Cited

U.S. PATENT DOCUMENTS

| | | | |
|---|---|---|---|
| 8,084,998 B2* | 12/2011 | Lampe-Onnerud | H02J 7/00 320/134 |
| 9,509,019 B2* | 11/2016 | Chiang | H01M 10/48 |
| 9,680,333 B1* | 6/2017 | Brooks | H02J 7/00714 |
| 9,692,088 B2 | 6/2017 | Koba et al. | |
| 9,742,041 B2* | 8/2017 | Sasaki | H01M 10/0569 |
| 2011/0300430 A1* | 12/2011 | Usami | H01M 10/052 429/144 |
| 2015/0331055 A1 | 11/2015 | Oi et al. | |
| 2017/0356962 A1 | 12/2017 | Takahashi et al. | |
| 2018/0062214 A1* | 3/2018 | Smith | H01M 10/05 |
| 2018/0109121 A1 | 4/2018 | Uchida | |
| 2018/0254514 A1* | 9/2018 | Li | H01M 10/0565 |
| 2020/0280203 A1* | 9/2020 | Sherstyuk | H01M 10/42 |
| 2021/0013555 A1* | 1/2021 | Pol | H01M 10/44 |
| 2021/0263108 A1* | 8/2021 | Li | H01M 10/488 |
| 2021/0359290 A1* | 11/2021 | Xu | H01M 4/5815 |
| 2021/0391591 A1* | 12/2021 | Goulet | H01M 8/18 |

FOREIGN PATENT DOCUMENTS

| | | |
|---|---|---|
| CN | 102522601 A | 6/2012 |
| CN | 104919643 A | 9/2015 |
| CN | 105083289 A | 11/2015 |
| CN | 106025407 A | 10/2016 |
| CN | 107492685 A | 12/2017 |
| CN | 107953786 A | 4/2018 |
| CN | 108123184 A | 6/2018 |
| CN | 108638890 A | 10/2018 |
| EP | 3258283 A1 | 12/2017 |
| JP | 2012028024 A | 2/2012 |
| JP | 2014127283 A | 7/2014 |
| JP | 2015187938 A | 10/2015 |
| WO | 2014167971 A1 | 10/2014 |

* cited by examiner

METHOD, DEVICE AND SYSTEM FOR RECOVERING RECOVERABLE FADED CAPACITY OF BATTERY

CROSS-REFERENCE TO RELATED APPLICATION

This application claims the benefit of priority to the Chinese patent application No. 201910338265.5 filed on Apr. 25, 2019, which is hereby incorporated by reference in its entirety into the present application.

TECHNICAL FIELD

The present disclosure relates to the field of batteries, and in particular, to a method, a device and a system for recovering recoverable faded capacity of a battery.

BACKGROUND

Accurate estimation of the maximum available capacity of the battery pack is important for estimation of the residual capacity, the residual energy and the like, and is also an important parameter reflecting the aging state of a battery cell. In general, capacity fade corresponds to irreversible damage inside the battery cell and cannot be recovered without destroying the battery cell structure.

SUMMARY

According to one aspect of the present disclosure, there is provided a method for recovering a recoverable faded capacity of a battery, comprising: determining a recoverable faded capacity of the battery; determining a corresponding lower limit of a battery parameter according to the recoverable faded capacity of the battery; instructing a discharging device to discharge the battery to the corresponding lower limit of the battery parameter.

In some embodiments of the present disclosure, the battery is a battery pack or a single battery cell.

In some embodiments of the present disclosure, the lower limit of the battery parameter is a lower limit of battery state of change or a lower limit of battery voltage.

In some embodiments of the present disclosure, the instructing the discharging device to discharge the battery to the corresponding lower limit of the battery parameter comprises: judging whether the recoverable faded capacity of the battery is greater than a predetermined recoverable threshold; and in the case that the recoverable faded capacity of the battery is greater than the predetermined recoverable threshold, instructing the discharging device to discharge the battery to the corresponding lower limit of the battery parameter.

In some embodiments of the present disclosure, the instructing the discharging device to discharge the battery to the corresponding lower limit of the battery parameter comprises: transmitting the corresponding lower limit of the battery parameter to a vehicle controller so that the vehicle controller displays the corresponding lower limit of the battery parameter to a user at a vehicle end and prompts the user to discharge the battery to the corresponding lower limit of the battery parameter.

In some embodiments of the present disclosure, instructing the discharging device to discharge the battery to the corresponding lower limit of the battery parameter: setting an electrical equipment to be in a maintenance mode in a predetermined time period or after determining recoverable faded capacity of the battery; and in the maintenance mode, instructing the discharging device to discharge the battery to the corresponding lower limit of the battery parameter.

In some embodiments of the present disclosure, the instructing the discharging device to discharge the battery to the corresponding lower limit of the battery parameter comprises: judging whether an initial battery state of charge when the battery is charged is in a dischargeable battery state of charge range; and under the condition that the initial battery state of charge is in the dischargeable battery state of charge range, instructing the discharging device to discharge the battery to the corresponding lower limit of the battery parameter.

In some embodiments of the present disclosure, the instructing the discharging device to discharge the battery to the corresponding lower limit of the battery parameter comprises: judging whether a specific battery cell exists in the battery pack, wherein the specific battery cell is a battery cell with recoverable faded capacity larger than a preset recoverable threshold value; under the condition that a specific battery cell exists in the battery pack, judging whether the state of charge of the specific battery cell is in a dischargeable battery state of charge range; and under the condition that the state of charge of the specific battery cell is in the dischargeable battery state of charge range, calculating the time required for discharging the specific battery cell to the corresponding lower limit of the battery parameter, and instructing the discharging device to discharge the specific battery cell to the corresponding lower limit of the battery parameter.

In some embodiments of the present disclosure, the instructing the discharging device to discharge the battery to the corresponding lower limit of the battery parameter further comprises: when the battery pack starts to charge and the battery charge state of the specific battery cell is not in the dischargeable battery state of charge range, instructing the discharging device to stop the operation of discharging the specific battery cell to the corresponding lower limit of the battery parameter.

In some embodiments of the present disclosure, the dischargeable battery state of charge range may not fully recover the recoverable faded capacity, and the dischargeable battery state of charge range is lower than a predetermined battery state of charge threshold.

In some embodiments of the present disclosure, the method for recovering the recoverable faded capacity of the battery further comprises: instructing a charging device to charge the battery.

In some embodiments of the present disclosure, the determining the recoverable faded capacity of the battery comprises: determining the recoverable faded capacity of the battery by adopting a historical operating condition method or an online estimation method.

In some embodiments of the present disclosure, the determining the recoverable faded capacity of the battery using a historical operating condition method comprises: determining a two-dimensional histogram of different battery state of charge usage intervals and current rates after the last capacity recovery; and performing accumulation calculation on experimental statistical data to obtain the recoverable faded capacity of the battery.

In some embodiments of the present disclosure, the determining the corresponding lower limit of the battery parameter based on the recoverable faded capacity of the battery comprises: determining the corresponding lower limit of the battery parameter according to the generation mode of the recoverable faded capacity and the current-voltage relationship.

In some embodiments of the present disclosure, the generation mode of the recoverable faded capacity is a battery state of charge cycle interval and time which generates the recoverable capacity.

In some embodiments of the present disclosure, the current-voltage relationship is a voltage change curve or a voltage capacity differential change curve under a constant current condition.

In some embodiments of the present disclosure, the battery is a battery pack or a single battery cell.

In some embodiments of the present disclosure, the lower limit of the battery parameter is a lower limit of battery state of change or a lower limit of battery voltage.

In another aspect of the present disclosure, there is provided a device for recovering recoverable faded capacity of a battery, comprising: a recoverable capacity determining module for determining the recoverable faded capacity of the battery; a parameter lower-limit determining module for determining a corresponding lower limit of a battery parameter according to the recoverable faded capacity of the battery; and a discharge control module for instructing the discharging device to discharge the battery to the corresponding lower limit of the battery parameter so as to increase the maximum usable capacity of the battery.

In some embodiments of the present disclosure, the device for recovering recoverable faded capacity of a battery is configured to perform operations for implementing the method for recovering recoverable faded capacity of a battery of any of the aforementioned embodiments.

According to another aspect of the present disclosure, there is provided a device for recovering recoverable faded capacity of a battery, comprising: a memory for storing instructions; and a processor for executing the instructions to enable the device for recovering the recoverable faded capacity of the battery to perform operations of the method for recovering the recoverable faded capacity of the battery according to any of the aforementioned embodiments.

According to another aspect of the present disclosure, there is provided a battery management system, comprising the device for recovering the recoverable faded capacity of a battery as claimed in any of the aforementioned embodiments.

According to another aspect of the present disclosure, there is provided a system for recovering the recoverable faded capacity of a battery comprises a discharging device, a charging device and a device for recovering the recoverable faded capacity of a battery as claimed in any of the aforementioned embodiments, or comprises a discharging device, a charging device and a battery management system according to any of the aforementioned embodiments.

The method can recover the recoverable faded capacity generated by part of a battery cell system, so that the battery cell can achieve the best performance.

BRIEF DESCRIPTION OF THE DRAWINGS

In order to more clearly illustrate the embodiments of the present disclosure or the technical solutions in the prior art, the drawings used for describing the embodiments or the prior art will be briefly described below, and it is obvious that the drawings in the following descriptions are only some embodiments of the present disclosure, and other drawings can be obtained according to these drawings by those skilled in the art without inventive effort.

DETAILED DESCRIPTION

Figure 1:
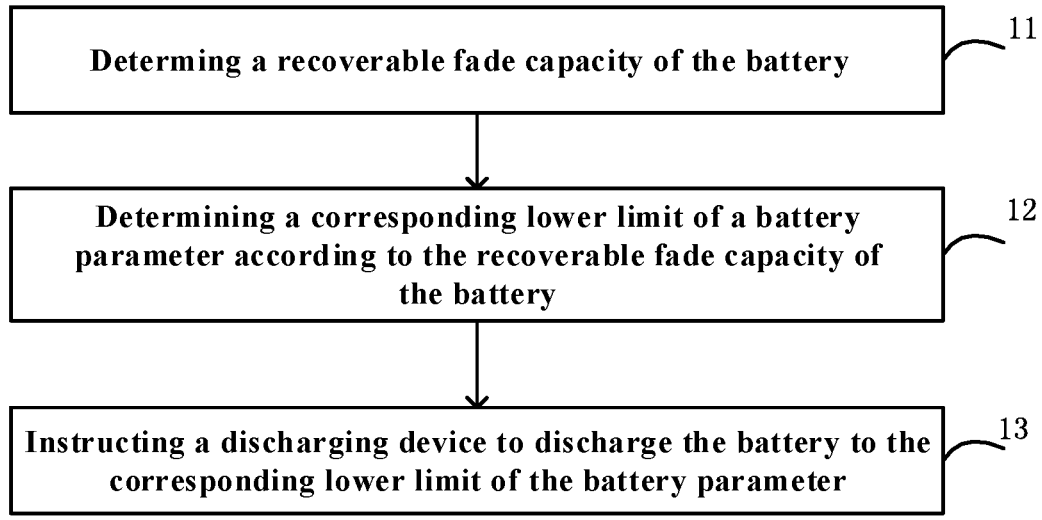
FIG. 1 is a schematic diagram of some embodiments of a method for recovering a recoverable faded capacity of a battery according to the present disclosure.

The technical solutions in the embodiments of the present disclosure will be clearly and completely described below with reference to the drawings in the embodiments of the present disclosure, and it is apparent that the described embodiments are only some, rather than all, of the embodiments of the present disclosure. The following description of at least one exemplary embodiment is merely exemplary in nature and is in no way intended to limit the disclosure, its application, or uses. All other embodiments, which can be derived by those of ordinary skill in the art based on the embodiments in the present disclosure without creative efforts, are within the scope of the present disclosure.

The relative arrangement of parts and steps, numerical expressions, and numerical values set forth in these embodiments do not limit the scope of the present disclosure unless specifically stated otherwise.

Meanwhile, it should be understood that the sizes of the respective parts shown in the drawings are not drawn to actual scale for convenience of description.

Techniques, methods, and apparatus known to those of ordinary skill in the relevant art may not be discussed in detail, but are to be considered a part of the specification where appropriate.

In all examples shown and discussed herein, any particular value should be construed as merely illustrative and not limitative. Thus, other examples of exemplary embodiments may have different values.

It should be noted that: similar reference numbers and letters in the following figures refer to similar items and, therefore, once an item is defined in one figure, it need not be discussed further in subsequent figures.

The applicant found that there are two parts of capacity fade for some battery cell systems: unrecoverable capacity fade and recoverable capacity fade (like a memory effect). The recoverable capacity fade referred to herein is the property of the battery cell itself, unlike the recoverable capacity fade of battery pack due to the inconsistency between battery cells. The unrecoverable capacity fade caused by the real aging of the battery cell reflects the real aging of the battery cell, but the recoverable capacity fade reduces the actual available capacity of the battery cell, and the best performance of the battery cell cannot be exerted.

The applicant also found that: since part of the battery cell system has such two parts as unrecoverable capacity fade and recoverable capacity fade in the charging and discharging process; the unrecoverable capacity fade is the unavailable capacity caused by the aging of the battery cell, and the recoverable capacity fade is the capacity that can be released again by the battery cell after being adjusted in a certain way in the cycle process, and this part of the capacity cannot reflect the aging state of the battery cell; when the available capacity of the current battery cell is tested, the true aging condition of the current battery cell may be overestimated due to the existence of recoverable capacity fade.

In view of the above technical problems, the present disclosure provides a method, a device and a system for recovering a recoverable faded capacity of a battery, which can recover parts of the recoverable capacity fade generated by a battery cell system, so that the battery cell can achieve the optimal performance.

Based on the above situation, the present disclosure provides a method, a device and a system for recovering the recoverable faded capacity of a battery, and a battery management system, which can recover the recoverable capacity fade generated by a part of a battery cell system, so that a battery cell can have the optimal performance.

FIG. 1 is a schematic diagram of some embodiments of a method for recovering the recoverable faded capacity of a battery according to the present disclosure. Preferably, the present embodiment may be performed by a device for recovering the recoverable faded capacity of the present disclosure. The method comprises the following steps 11 to 13.

In step 11, the recoverable faded capacity of the battery is determined.

In some embodiments of the present disclosure, the battery may be a battery pack or a single battery cell.

In some embodiments of the present disclosure, one battery pack may comprise a plurality of battery cells.

In some embodiments of the present disclosure, step 11 may comprise: determining the recoverable faded capacity of the battery by adopting a historical operating condition method or an online estimation method.

In some embodiments of the present disclosure, the determining the recoverable faded capacity of the battery by adopting a historical operating condition method comprises: determining a two-dimensional histogram of different battery state of charge usage intervals and current rates after the last capacity recovery; and performing accumulation calculation on experimental statistical data to obtain the recoverable faded capacity of the battery.

In some embodiments of the present disclosure, the determining the recoverable faded capacity of the battery by adopting the historical operating condition method may comprise: recording the SOC (State of Charge, also called residual capacity) of a battery pack before each charging and the SOC after each charging, counting the cycle number and the temperature in different SOC using intervals, and looking up a table to determine the amount of the recoverable faded capacity.

In some embodiments of the present disclosure, the determining the recoverable faded capacity of the battery by adopting the historical operating condition method may comprise: according to the recoverable faded capacity determined by different cycle numbers and temperatures calibrated offline, calibrating the amount of the recoverable faded capacity of each cycle when different SOC use intervals are used, or fitting the recoverable faded capacity through functions such as polynomials and the like (note that the fade of each cycle can be a positive value and a negative value); and accumulating the recoverable faded capacity according to the SOC interval of the discharge working condition before each charging.

In some embodiments of the present disclosure, the determining the recoverable faded capacity of the battery by adopting the online estimation method may comprise: calculating the recoverable faded capacity of the battery according to the current-voltage relationship, such as: calculating the recoverable faded capacity of the battery according to the voltage change curve or the voltage capacity differential change curve of the constant current condition.

In some embodiments of the present disclosure, the determining the recoverable faded capacity of the battery by adopting the online estimation method may comprise: performing offline analysis of a voltage capacity differential change curve of the battery to determine the offset of a specific peak and the variation of the peak height; and acquiring the recoverable faded capacity online according to the corresponding relation.

In step 12, the corresponding lower limit of the battery parameter is determined according to the recoverable faded capacity of the battery.

In some embodiments of the present disclosure, the lower limit of the battery parameter may be a battery state of charge lower limit (SOC lower limit) or a voltage lower limit.

In some embodiments of the present disclosure, step 12 may comprise: determining the corresponding lower limit of the battery parameter according to the generation mode of the recoverable faded capacity and the current-voltage relationship.

In some embodiments of the present disclosure, the generation mode of the recoverable faded capacity may be a battery state of charge cycle interval and time for generating the recoverable capacity.

In some embodiments of the present disclosure, the current-voltage relationship may be a voltage variation curve or a voltage capacity differential variation curve of a constant current condition.

In some embodiments of the present disclosure, step 12 may comprise: performing offline analysis of a voltage capacity differential change curve of the battery cell, and determining that the deviation of a specific peak and the variation of the peak height have a corresponding relation with a specific SOC lower limit; obtaining a specific SOC lower limit online according to the corresponding relation.

In some embodiments of the present disclosure, the corresponding SOC lower limit or voltage lower limit in step 12 may be obtained by means of offline calibration, or may be obtained by means of online calculation.

In some embodiments of the present disclosure, step 12 may comprise: obtaining corresponding SOC lower limit or voltage lower limit required for recovering different percentages corresponding to the recoverable capacity generated in different modes.

In some embodiments of the present disclosure, step 12 may comprise: judging whether the online estimated recoverable capacity is larger than a threshold value or not, so that the use of electric equipment with batteries such as vehicle and the like is influenced. If the use of the electric device with batteries installed such as a vehicle is influenced, a specific SOC lower limit or voltage lower limit required for recovering the capacity is calculated according to the generation manner of the recoverable capacity and the current-voltage relationship.

In step 13, a discharging device is instructed to discharge the battery to the corresponding lower limit of the battery parameter so as to improve the maximum available capacity of the battery.

In some embodiments of the present disclosure, step 13 may comprise: judging whether the recoverable faded capacity of the battery is greater than a preset recoverable threshold value; and in the case that the recoverable faded capacity of the battery is greater than a predetermined recoverable threshold, instructing the discharging device to discharge the battery to the corresponding lower limit of the battery parameter.

In some embodiments of the present disclosure, the predetermined recoverable threshold may be 3% of the nominal capacity.

In some embodiments of the present disclosure, step 13 may comprise: indicating the discharging device to discharge the battery to the corresponding lower limit of the battery parameter by adopting methods such as a user-prompting method, a charging control method, a periodic maintenance method, a balancing method and the like.

In some embodiments of the present disclosure, after step 13, the method for recovering the recoverable faded capacity of the battery may further comprise: instructing the charging device to charge the battery to indicate an increase in the maximum available capacity of the battery.

The following describes the steps of discharging the battery to the corresponding lower limit of the battery parameter in the four different ways, respectively.

A User-Prompting Method

In some embodiments of the present disclosure, the user-prompting method may comprise: determining the recoverable faded capacity of the battery; judging whether the recoverable faded capacity of the battery is greater than a preset recoverable threshold value; in the case where the recoverable faded capacity of the battery is greater than a predetermined recoverable threshold, the lower limit of the corresponding battery parameter is transmitted to a vehicle controller (e.g., a VCU (Vehicle Control Unit)) so that the vehicle controller displays the corresponding battery parameter lower limit to a user at the vehicle, prompting the user to discharge the battery to the corresponding lower limit of the battery parameter.

In other embodiments of the present disclosure, the user-prompting method may comprise: calculating the recoverable faded capacity online; judging whether the recoverable faded capacity of the battery is greater than a preset recoverable threshold value; in the event that the recoverable faded capacity of the battery is greater than a predetermined recoverable threshold, the corresponding battery parameter lower limit is recommended to the user via the user interface to prompt the vehicle user to discharge to the corresponding battery parameter lower limit (e.g., a particular SOC lower limit or voltage lower limit) at an appropriate opportunity.

A Charging Control Method

The method requires the charging pile to have a discharging function.

In some embodiments of the present disclosure, the charging control method may comprise: judging whether the recoverable faded capacity of the battery is larger than a preset recoverable threshold value; under the condition that the recoverable faded capacity of the battery is larger than a preset recoverable threshold value, judging whether the initial battery charge state under the charging condition is in a dischargeable battery state of charge range or not; and under the condition that the initial battery state of charge is in the dischargeable battery state of charge range, indicating the discharging device to discharge the battery to the lower limit of the corresponding battery parameter.

In some embodiments of the present disclosure, the dischargeable battery state of charge range may not fully recover the recoverable faded capacity, and the dischargeable battery state of charge range is lower than a predetermined battery state of charge threshold.

In other embodiments of the present disclosure, the charging control method may comprise: calculating the recoverable faded capacity online; judging whether the recoverable faded capacity of the battery is larger than a preset recoverable threshold value; when the recoverable faded capacity of the battery is larger than a predetermined recoverable threshold value, after the charging gun is inserted, it is determined whether the initial SOC during charging is within a dischargeable SOC range, and the reason for making the determination is that if the initial SOC is too high, the discharging will cause energy waste. If the condition is satisfied, a fixed charging flow is set so that the normal charging is started after discharging to a specific SOC lower limit or voltage lower limit.

A Periodic Maintenance Method

In some embodiments of the present disclosure, the periodic maintenance may comprise: setting an electric device (e.g., a vehicle) to a maintenance mode for a predetermined period of time or a period of time in which a recoverable faded capacity of the battery is determined; in the maintenance mode, judging whether the recoverable faded capacity of the battery is greater than a preset recoverable threshold value; and in the case that the recoverable faded capacity of the battery is greater than a predetermined recoverable threshold, instructing the external discharging device to discharge the battery to the corresponding lower limit of the battery parameter.

A Balancing Method

The method is mainly used for the situation that only part of the battery cells have recoverable capacity, and it is unnecessary to adjust the whole pack.

In some embodiments of the present disclosure, the balancing method may comprise: judging whether a particular battery cell whose recoverable faded capacity is larger than a preset recoverable threshold value exists in the battery pack; under the condition that the particular battery cell exists in the battery pack, judging whether the state of charge of the particular battery cell is in a dischargeable battery state of charge range; calculating the time required for discharging the particular battery cell to the corresponding lower limit of the battery parameter under the condition that the state of charge of the particular battery cell is in the dischargeable battery state of charge range, and instructing a discharging device to discharge the particular battery cell to the corresponding lower limit of the battery parameter; and when the battery pack starts to be charged and the state of charge of the particular battery core is not in the dischargeable battery state of charge range, the discharging device is instructed to stop the operation of discharging the particular battery cell to the corresponding lower limit of the battery parameter.

In some embodiments of the present disclosure, the balancing method may comprise: judging whether a particular battery cell whose recoverable faded capacity larger than a preset recoverable threshold value exists in the battery pack; in the case where the particular battery cell exists in the battery pack, it is determined whether or not the SOC of the particular battery cell is within a dischargeable SOC range, wherein the recoverable faded capacity may not be fully recovered in the dischargeable battery state of charge range, and the dischargeable battery state of charge range, and the dischargeable battery state-of-charge range is lower than a predetermined battery state-of-charge threshold, because the discharging would cause energy waste if the initial SOC is too high; if the condition is met, calculating the time required for balancing the particular battery cell to the specific SOC, and starting balancing, wherein the balancing is the operation of instructing a discharging device to stop discharging the specific battery cell to the corresponding lower limit of the battery parameter; the balancing stops after the SOC is not within the dischargeable SOC range because of the increase of the SOC when the pack resumes charging.

According to the method for recovering the recoverable faded capacity of the battery provided by the embodiments of the present disclosure, the recoverable capacity fade generated by part of the battery cell system can be recovered when discharged to a specific SOC lower limit or voltage lower limit, namely, more capacity can be charged when charged again after being discharged to the specific SOC lower limit or voltage lower limit. Moreover, the recoverable capacity can be maintained for a long time after the recovery.

According to the embodiment of the disclosure, the recoverable capacity fade generated by part of the battery cell system can be recovered, so that the battery cell can have the optimal performance.

The second embodiment (charging control method) will be described below with reference to specific embodiments.

In some embodiments of the present disclosure, a method of recovering a recoverable faded capacity of a battery based on charge control may comprise the following steps 1 to 4:

In step 1, the recoverable capacity is calculated on line to obtain the recoverable capacity which is 5% of the nominal capacity and is higher than a preset recoverable threshold value, and recovery is required.

In some embodiments of the present disclosure, specific examples of recoverable capacity calculation methods (historical operating condition methods) may comprise: counting and acquiring different SOC use interval-current rate two-dimensional histograms after the last capacity recovery, and performing accumulation calculation by using offline experimental statistical data to obtain a recoverable capacity value.

In step 2, a specific SOC lower limit is obtained by calculating according to the voltage capacity differential change curve. If the discharge is carried out to 30% SOC, the capacity can be recovered to 3%, and if the discharge is carried out to 20%, the capacity can be recovered to 5%. The specific SOC lower limit is set to 20% to recover completely.

In some embodiments of the present disclosure, the specific SOC lower limit is derived experimentally. But the specific values are different under different working conditions.

In some embodiments of the present disclosure, a specific method of calculating a specific SOC lower limit may comprise: performing offline analysis of the voltage capacity differential change curve of the battery cell, wherein the offset of the specific peak and the variation of the peak height have a corresponding relation with a specific SOC lower limit, and acquiring the specific SOC lower limit on line according to the corresponding relation.

In step 3, capacity recovery is performed by using a charging control method. When the SOC is 25% at the beginning of charging, the BMS (Battery Management System) sends a discharging instruction to the charging pile, the battery is discharged to 20% at first, and then normal charging is carried out.

Figure 2A:
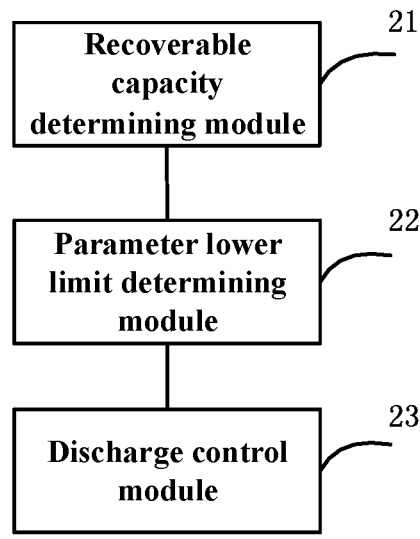
FIG. 2a is a schematic diagram of some embodiments of a device for recovering the recoverable faded capacity of a battery according to the present disclosure.

FIG. 2a is a schematic diagram of some embodiments of a device for recovering the recoverable faded capacity of the battery according to the present disclosure. As shown in FIG. 2a, the device for recovering the recoverable faded capacity of the battery may comprise a recoverable capacity determining module 21, a parameter lower limit determining module 22, and a discharge control module 23.

The recoverable capacity determination module 21 is used for determining the recoverable faded capacity of the battery.

In some embodiments of the present disclosure, the battery may be a battery pack or a single battery cell.

In some embodiments of the present disclosure, one battery pack may comprise a plurality of battery cells.

In some embodiments of the present disclosure, the recoverable capacity determination module 21 may be used to determine the recoverable faded capacity of the battery using a historical operating condition method or an online estimation method.

In some embodiments of the present disclosure, the recoverable capacity determining module 21 may be configured to statistically determine a two-dimensional histogram of the usage interval and the current rate of different battery states of charge after the last capacity recovery; and performing accumulation calculation on experimental statistical data to obtain the recoverable faded capacity of the battery.

In some embodiments of the present disclosure, the recoverable capacity determination module 21 may be configured to construct a recoverable faded capacity estimation model according to historical data, input current battery parameters into the recoverable faded capacity estimation model, and determine a current recoverable faded capacity of the battery.

In some embodiments of the present disclosure, the recoverable capacity determining module 21 may be configured to record the SOC of the battery before charging and the SOC after charging each time, make statistics of the number of cycles and the temperature in different SOC usage intervals, and look up a table to determine the amount of the recoverable faded capacity.

In some embodiments of the present disclosure, the recoverable capacity determining module 21 may be configured to calibrate the amount of the recoverable faded capacity per loop at different SOC usage intervals according to the recoverable faded capacity determined by the number of different cycles and the temperature calibrated offline, or fit the recoverable faded capacity per loop through a polynomial equation (note that the fade per cycle may be a positive value and a negative value); and accumulate the recoverable faded capacity according to the SOC interval of the discharge working condition before each charging.

In some embodiments of the present disclosure, the recoverable capacity determination module 21 may be configured to calculate a recoverable faded capacity of the battery according to a current-voltage relationship, such as calculating the recoverable faded capacity of the battery according to the voltage change curve or the voltage capacity differential change curve of the constant current condition.

In some embodiments of the present disclosure, the recoverable capacity determining module 21 may be configured to analyze the voltage capacity differential change curve of the battery offline, and determine the deviation of a specific peak and the variation of the peak height; on line obtain the recoverable faded capacity of the battery according to the corresponding relation The parameter lower limit determining module 22 is used for determining the corresponding battery parameter lower limit according to the recoverable faded capacity of the battery.

In some embodiments of the present disclosure, the battery parameter lower limit may be a battery state of charge lower limit (SOC lower limit) or a voltage lower limit.

In some embodiments of the present disclosure, the parameter lower limit determination module 22 may be configured to determine a corresponding battery parameter lower limit according to a current-voltage relationship and a generation mode of the recoverable faded capacity.

In some embodiments of the present disclosure, the generation mode of the recoverable faded capacity may be a battery state of charge cycle interval and time for generating the recoverable capacity.

In some embodiments of the present disclosure, the current-voltage relationship may be a voltage variation curve or a voltage capacity differential variation curve of a constant current condition.

In some embodiments of the present disclosure, the parameter lower limit determining module 22 may be configured to perform offline analysis of the voltage capacity differential change curve of the battery cell, and determine that the offset of the specific peak and the variation of the peak height have a corresponding relationship with the specific SOC lower limit; and acquire a specific SOC lower limit on line according to the corresponding relation.

In some embodiments of the present disclosure, the corresponding SOC lower limit or voltage lower limit may be obtained by means of offline calibration, or may be obtained by means of online calculation.

In some embodiments of the present disclosure, the parameter lower limit determination module 22 may be used to obtain a corresponding lower SOC limit or lower voltage limit required to recover different percentages of the recoverable capacity generated in different manners.

In some embodiments of the present disclosure, the parameter lower limit determining module 22 may be configured to determine whether the online estimated recoverable capacity is greater than a threshold value, which affects the use of an electrical device equipped with a battery, such as a vehicle. If the use of the battery-mounted electric device such as a vehicle is affected, a specific SOC lower limit or voltage lower limit required for the recovery capacity is calculated from the generation manner of the recoverable capacity and the current-voltage relationship.

The discharge control module 23 is used for instructing the discharging device to discharge the battery to the corresponding lower limit of the battery parameter so as to improve the maximum available capacity of the battery.

In some embodiments of the present disclosure, the discharge control module 23 may be configured to determine whether the recoverable faded capacity of the battery is greater than a predetermined recoverable threshold; and in the case that the recoverable faded capacity of the battery is greater than a predetermined recoverable threshold, instruct the discharging device to discharge the battery to the corresponding lower limit of the battery parameter.

In some embodiments of the present disclosure, the discharge control module 23 may be configured to instruct the discharging device to discharge the battery to the corresponding battery parameter lower limit using the corresponding control strategy under different battery operating conditions.

In some embodiments of the present disclosure, the discharge control module 23 may be configured to instruct the discharging device to discharge the battery to the corresponding battery parameter lower limit using a user-prompting method, a charging control method, a periodic maintenance method, a balancing method, or the like.

In some embodiments of the present disclosure, the discharge control module 23 may be configured to determine whether the recoverable faded capacity of the battery is greater than a predetermined recoverable threshold; and transmitting the corresponding battery parameter lower limit to a vehicle controller when the recoverable faded capacity of the battery is greater than a predetermined recoverable threshold value, so that the vehicle controller displays the corresponding battery parameter lower limit to a user at the vehicle and prompts the user to discharge the battery to the corresponding battery parameter lower limit.

In some embodiments of the present disclosure, the discharge control module 23 may be configured to determine whether the recoverable faded capacity of the battery is greater than a predetermined recoverable threshold; under the condition that the recoverable faded capacity of the battery is greater than a preset recoverable threshold value, judge whether the initial battery state of charge under the charging condition is in a dischargeable battery state of charge range or not; and under the condition that the initial battery state of charge is in the dischargeable battery state of charge range, indicate the discharging device to discharge the battery to the corresponding battery parameter lower limit.

In some embodiments of the present disclosure, the dischargeable battery state of charge range may not fully recover the recoverable faded capacity, and the dischargeable battery state of charge range is lower than a predetermined battery state of charge threshold.

In some embodiments of the present disclosure, the discharge control module 23 may be configured to set the electrical device to the maintenance mode for a predetermined period of time or a period of time that determines a recoverable capacity of the battery; in the maintenance mode, judge whether the recoverable faded capacity of the battery is larger than a preset recoverable threshold value; and in the case that the recoverable faded capacity of the battery is greater than a predetermined recoverable threshold, instruct the external discharging device to discharge the battery to the corresponding battery parameter lower limit.

In some embodiments of the present disclosure, the discharge control module 23 may be configured to determine whether a particular battery cell whose recoverable faded capacity is greater than a predetermined recoverable threshold value exists in the battery pack; under the condition that a particular battery cell exists in the battery pack, judge whether the state of charge of the particular battery cell is in a dischargeable battery state of charge range; and under the condition that the state of charge of the particular battery cell is in the dischargeable battery state of charge range, calculate the time required for discharging the particular battery cell to the corresponding lower limit of the battery parameter, and indicating the discharging device to discharge the specific battery cell to the corresponding lower limit of the battery parameter.

In some embodiments of the present disclosure, the discharge control module 23 may be further configured to instruct the discharging device to stop the operation of discharging the particular battery cell to the corresponding lower limit of the battery parameter when the battery pack starts to be charged and the state of charge of the particular battery cell is not within the dischargeable battery state of charge range.

Figure 2B:
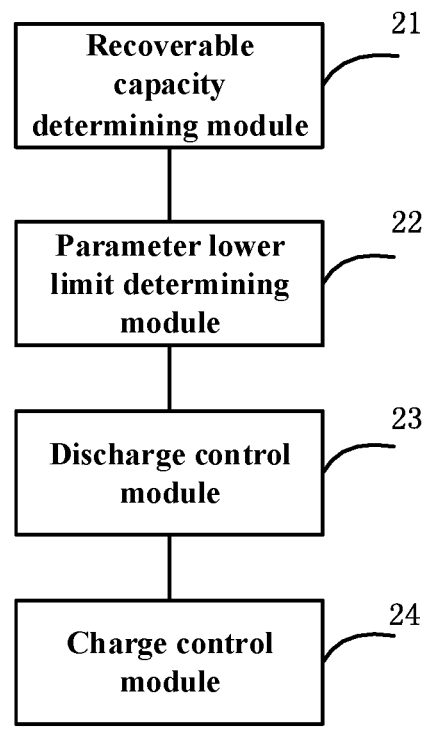
FIG. 2b is a schematic diagram of still another embodiment of a device for recovering the recoverable faded capacity of a battery according to the present disclosure.

FIG. 2b is a schematic diagram of still other embodiments of a recovery device for recovering faded capacity of a battery according to the present disclosure. Compared to the embodiment of FIG. 2a, in FIG. 2b, the device for recovering the recoverable faded capacity of the battery may comprise a charge control module 24.

The charge control module 24 is used for instructing the charging device to charge the battery so as to display the increase of the maximum available capacity of the battery.

In some embodiments of the present disclosure, the device for recovering a recoverable faded capacity of a battery is configured to perform operations for implementing the method for recovering a recoverable faded capacity of a battery as described in any one of the embodiments (e.g., the embodiment of FIG. 1).

According to the device for recovering the recoverable faded capacity of the battery provided by the embodiment of the disclosure, the recoverable faded capacity generated by part of the electric core system can be recovered when the battery cell system is discharged to a particular SOC lower limit or voltage lower limit, namely, more capacity can be charged after the electric core system is discharged to the specific SOC lower limit or voltage lower limit and the recoverable capacity can be maintained for a long time after being recovered.

Figure 3:
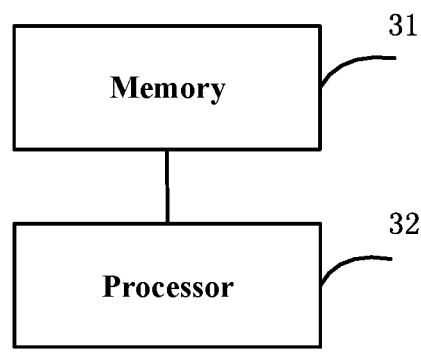
FIG. 3 is a schematic diagram of other embodiments of a device for recovering the recoverable faded capacity of a battery according to the present disclosure.

FIG. 3 is a schematic diagram of other embodiments of a device for recovering the recoverable faded capacity of a battery according to the present disclosure. As shown in FIG. 3, the device for recovering the recoverable faded capacity of a battery may comprise a memory 31 and a processor 32.

The memory 31 is used for storing instructions.

The processor 32 is used for executing the instructions to cause the battery recoverable faded capacity recovery device to perform operations to implement the method for recovering battery recoverable faded capacity as described in any of the above embodiments (e.g., the embodiment of FIG. 1).

According to the embodiments of the present disclosure, the recoverable faded capacity generated by part of the battery cell system can be recovered, so that the battery cell can have the optimal performance.

Figure 4:
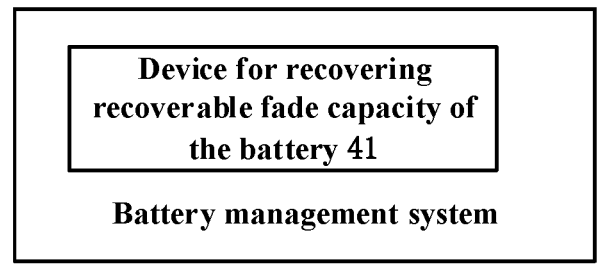
FIG. 4 is a schematic diagram of some embodiments of a battery management system of the present disclosure.

FIG. 4 is a schematic diagram of some embodiments of a battery management system of the present disclosure. As shown in FIG. 4, the battery management system may comprise a device 41 for recovering the recoverable faded capacity of the battery.

The device 41 for recovering the recoverable faded capacity of the battery can be the device for recovering the recoverable faded capacity of the battery according to any one of the embodiments (such as the embodiment of FIG. 2a, FIG. 2b or FIG. 3).

According to the battery management system provided by the embodiment of the disclosure, the recoverable faded capacity generated by part of the battery cell system can be recovered when the batter cell system is discharged to a particular SOC lower limit or voltage lower limit, namely, more capacity can be charged by recharging after the battery cell system is discharged to the particular SOC lower limit or the voltage lower limit, and the recoverable capacity can be maintained for a long time after being recovered.

Figure 5:
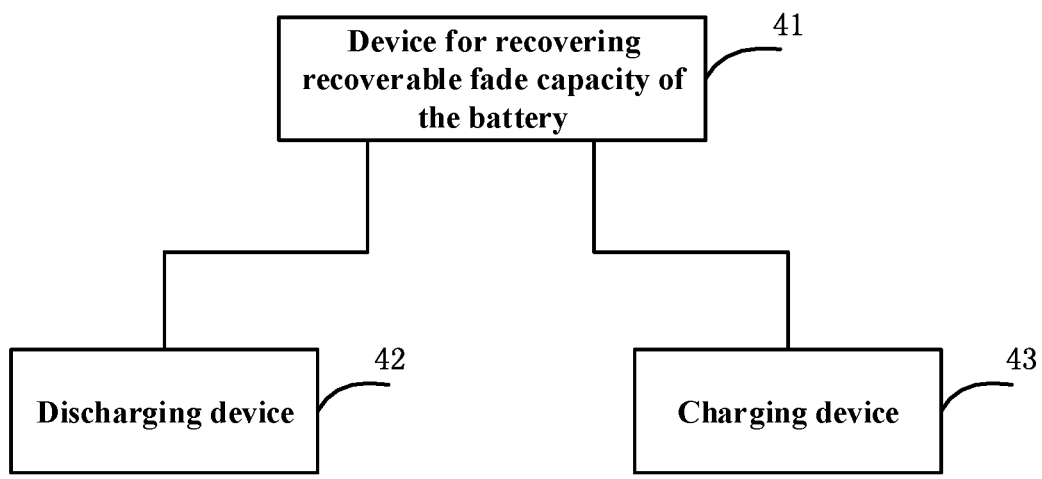
FIG. 5 is a schematic diagram of some embodiments of a system for recovering the recoverable faded capacity of a battery according to the present disclosure.

FIG. 5 is a schematic diagram of some embodiments of a battery recoverable faded capacity recovery system of the present disclosure. As shown in FIG. 5, the system for recovering the recoverable faded capacity of the battery may comprise: a device 41 for recovering the recoverable faded capacity of the battery, a discharging device 42, and a charging device 43.

The device 41 for recovering the recoverable faded capacity of the battery may be a device for recovering the recoverable faded capacity of the battery as described in any one of the embodiments (e.g., the embodiment of FIG. 2 or FIG. 3).

The discharging device 42 is used for discharging the battery to the corresponding lower limit of the battery parameter according to the instruction of the device 41 for recovering the recoverable faded capacity of the battery.

The charging device 43 is used for charging the battery according to the instruction of the device 41 for recovering the recoverable faded capacity of the battery, under the condition that the battery is discharged to the corresponding lower limit of the battery parameter, so as to improve the maximum available capacity of the battery.

In some embodiments of the present disclosure, the discharging device 42 and the charging device 43 may be integrally provided.

In some embodiments of the present disclosure, the integrally provided charging and discharging device may be implemented as a charging and discharging device (e.g., a charging pile) having a discharging function.

According to the recovery system of the recoverable faded capacity of the battery provided by the embodiment of the disclosure, the recoverable faded capacity generated by part of the battery cell system can be recovered when the battery cell system is discharged to a particular SOC lower limit or voltage lower limit, namely, more capacity can be charged after the battery cell system is discharged to the particular SOC lower limit or voltage lower limit and the recoverable capacity can be maintained for a long time after being recovered.

Figure 6:
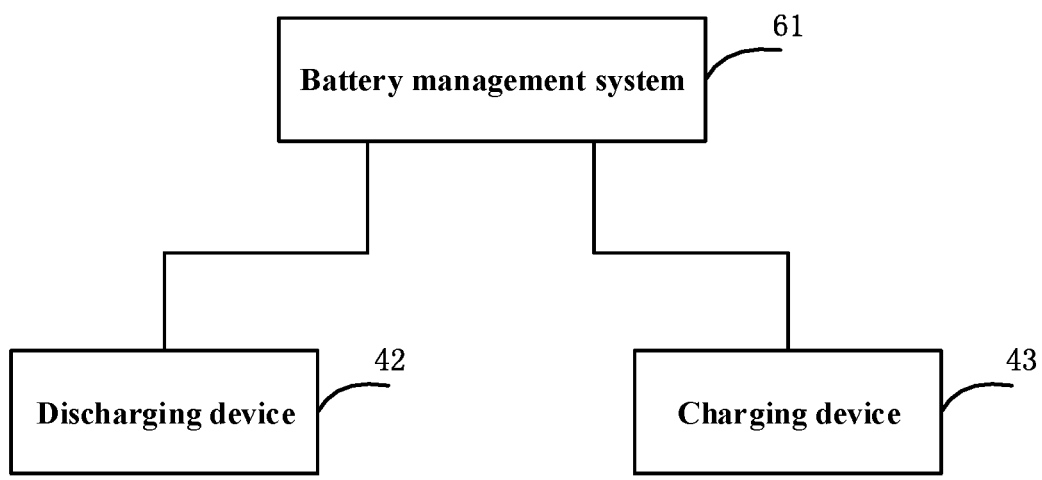
FIG. 6 is a schematic diagram of other embodiments of a system for recovering the recoverable faded capacity of a battery according to the present disclosure.

FIG. 6 is a schematic diagram of another embodiment of a recovery system for a battery recoverable faded capacity of the present disclosure. As shown in FIG. 6, the system for recovering the recoverable faded capacity of the battery may comprise: a battery management system 61, a discharging device 42 and a charging device 43.

The battery management system 61 may be the battery management system described in any one of the embodiments (for example, the embodiment of FIG. 4).

The discharging device 42 is used for discharging the battery to the corresponding lower limit of the battery parameter according to the instruction of the device 41 for recovering the recoverable faded capacity of the battery.

The charging device 43 is used for charging the battery according to the instruction of the device 41 for recovering the recoverable faded capacity of the battery, under the condition that the battery is discharged to the corresponding lower limit of the battery parameter, so as to improve the maximum available capacity of the battery.

In some embodiments of the present disclosure, the discharging device 42 and the charging device 43 may be integrally provided.

In some embodiments of the present disclosure, the integrally provided charging and discharging device may be implemented as a charging and discharging device (e.g., a charging pile) having a discharging function.

According to the embodiment of the disclosure, the recoverable faded capacity generated by part of the electric core system can be recovered, so that the electric core can exert the optimal performance.

The device for recovering the recoverable faded capacity of the battery described above may be implemented as a general purpose processor, a Programmable Logic Controller (PLC), a Digital Signal Processor (DSP), an Application Specific Integrated Circuit (ASIC), a Field Programmable Gate Array (FPGA) or other programmable logic device, discrete gate or transistor logic, discrete hardware components, or any suitable combination thereof for performing the functions described herein.

Thus far, the present disclosure has been described in detail. Some details that are well known in the art have not been described in order to avoid obscuring the concepts of the present disclosure. Those skilled in the art can fully understand how to implement the technical solutions disclosed herein based on the above description.

Those of ordinary skill in the art will appreciate that all or a portion of the steps for implementing the above-described embodiments may be performed by hardware, and that the associated hardware may be instructed to perform by a program, which may be stored on a computer-readable storage medium, such as a read-only memory, a magnetic or optical disk, or the like.

The description of the present disclosure has been presented for purposes of illustration and description, and is not intended to be exhaustive or limited to the disclosure in the form disclosed. Many modifications and variations will be apparent to those of ordinary skill in the art. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method for recovering the recoverable faded capacity of a battery, comprising:
   determining a recoverable faded capacity of the battery;
   determining a corresponding lower limit of a battery parameter according to the recoverable faded capacity of the battery, based on a generation mode of the recoverable faded capacity, the current-voltage relationship and required percentages of the recoverable faded capacity of the battery, wherein different required percentages of the recoverable faded capacity of the battery determine corresponding different lower limits of the battery parameter, the generation mode of the recoverable faded capacity is a battery state of charge cycle interval and time which generates the recoverable capacity, and the current-voltage relationship is a voltage change curve or a voltage capacity differential change curve under a constant current condition; and
   instructing a discharging device to discharge the battery to the corresponding lower limit of the battery parameter in the case where an initial battery state of charge is in a dischargeable range of battery state of charge,
   wherein instructing the discharging device to discharge the battery to the corresponding lower limit of the battery parameter comprises:
      judging whether the recoverable faded capacity of the battery is larger than a preset recoverable threshold value;
      in the case that the recoverable faded capacity of the battery is greater than the predetermined recoverable threshold, instructing the discharging device to discharge the battery to the corresponding lower limit of the battery parameter;
      setting an electrical equipment to be in a maintenance mode in a predetermined time period or after determining recoverable faded capacity of the battery; and
      in the maintenance mode, instructing the discharging device to discharge the battery to the corresponding lower limit of the battery parameter.

2. The method for recovering the recoverable faded capacity of a battery according to claim 1, wherein:
   the battery is a battery pack or a single battery cell; and/or
   the lower limit of the battery parameter is a lower limit of battery state of charge or a lower limit of battery voltage.

3. The method for recovering a recoverable faded capacity of a battery according to claim 2, wherein instructing the discharging device to discharge the battery to the corresponding lower limit of the battery parameter comprises:
   judging whether a specific battery cell exists in a battery pack, wherein the specific battery cell is a battery cell with recoverable faded capacity larger than a preset recoverable threshold value; under the condition that a specific battery cell exists in the battery pack, judging whether the state of charge of the specific battery cell is in a dischargeable battery state of charge range; and
   under the condition that the state of charge of the specific battery cell is in the dischargeable battery state of charge range, calculating the time required for discharging the specific battery cell to the corresponding lower limit of the battery parameter, and instructing the discharging device to discharge the specific battery cell to the corresponding lower limit of the battery parameter.

4. The method for recovering a recoverable faded capacity of a battery according to claim 3, wherein instructing the discharging device to discharge the battery to the corresponding lower limit of the battery parameter further comprises:
   when the battery pack starts to be charged and the battery charge state of the specific battery cell is not in the dischargeable battery state of charge range, instructing the discharging device to stop the operation of discharging the specific battery cell to the corresponding lower limit of the battery parameter.

5. The method for recovering the recoverable faded capacity of a battery according to claim 1, wherein instructing the discharging device to discharge the battery to the corresponding lower limit of the battery parameter comprises:
   transmitting the corresponding lower limit of the battery parameter to a vehicle controller so that the vehicle controller displays the corresponding lower limit of the battery parameter to a user at a vehicle end and prompts the user to discharge the battery to the corresponding lower limit of the battery parameter.

6. The method for recovering the recoverable faded capacity of a battery according to claim 1, wherein instructing the discharging device to discharge the battery to the corresponding lower limit of the battery parameter comprises:
   judging whether an initial battery state of charge when the battery is charged is in a dischargeable battery state of charge range; and
   under the condition that the initial battery state of charge is in the dischargeable battery state of charge range, instructing the discharging device to discharge the battery to the corresponding lower limit of the battery parameter.

7. The method for recovering a recoverable faded capacity of a battery according to claim 6, wherein the dischargeable battery state of charge range is lower than a predetermined battery state of charge threshold.

8. The method for recovering a recoverable faded capacity of a battery according to claim 1, wherein:

the method for recovering the recoverable faded capacity of the battery further comprises: instructing a charging device to charge a battery; and/or, the determining the recoverable faded capacity of the battery comprises: determining the recoverable faded capacity of the battery by adopting a historical operating condition method or an online estimation method.

9. The method for recovering recoverable faded capacity of a battery according to claim 8, wherein determining the recoverable faded capacity of the battery by adopting a historical operating condition method comprises:

determining a two-dimensional histogram of different battery state of charge usage intervals and current rates after the last capacity recovery, taking the two-dimensional histogram as experimental statistical data; and performing accumulation calculation on experimental statistical data to obtain the recoverable faded capacity of the battery.

10. A device for recovering recoverable faded capacity of a battery, comprising:

a processor; and a memory storing instructions that, when executed by the processor, cause the device to:

determine a recoverable faded capacity of the battery;

determine a corresponding lower limit of a battery parameter according to the recoverable faded capacity of the battery based on a generation mode of the recoverable faded capacity, the current-voltage relationship, and required percentages of the recoverable faded capacity of the battery, wherein different required percentages of the recoverable faded capacity of the battery determine corresponding different lower limits of the battery parameter, the generation mode of the recoverable faded capacity is a battery state of charge cycle interval and time which generates the recoverable capacity, and the current-voltage relationship is a voltage change curve or a voltage capacity differential change curve under a constant current condition; and instruct a discharging device to discharge the battery to the corresponding lower limit of the battery parameter in the case where an initial battery state of charge is in a dischargeable range of battery state of charge, judging whether the recoverable faded capacity of the battery is larger than a preset recoverable threshold value;

in the case that the recoverable faded capacity of the battery is greater than the predetermined recoverable threshold, instructing the discharging device to discharge the battery to the corresponding lower limit of the battery parameter;

setting an electrical equipment to be in a maintenance mode in a predetermined time period or after determining recoverable faded capacity of the battery; and in the maintenance mode, instructing the discharging device to discharge the battery to the corresponding lower limit of the battery parameter.

11. A battery management system, comprising the device for recovering the recoverable faded capacity of a battery as claimed in claim 10.

12. A system for recovering the recoverable faded capacity of a battery comprising:

a discharging device;

a charging device; and a battery management system as claimed in claim 11.

13. A system for recovering the recoverable faded capacity of a battery comprising:

a discharging device;

a charging device; and a device for recovering the recoverable faded capacity of a battery as claimed in claim 10.

* * * * *